United States Patent

Kobayashi

Patent Number: 5,838,488
Date of Patent: Nov. 17, 1998

[54] OPTICAL AMPLIFIER GAIN CONTROL CIRCUITRY USING A VARIABLE REFERENCE CORRESPONDING TO THE NUMBER OF MULTIPLEXED WAVELENGTHS

[75] Inventor: Kiyoto Kobayashi, Tokyo, Japan

[73] Assignee: NEC Corporation, Tokyo, Japan

[21] Appl. No.: 869,831

[22] Filed: Jun. 5, 1997

[30] Foreign Application Priority Data

Jun. 6, 1996 [JP] Japan ................................. 8-144490

[51] Int. Cl.$^6$ .......................... H04B 10/16; H04B 10/17; H01S 3/16

[52] U.S. Cl. .......................... 359/341; 359/124; 359/160; 359/177

[58] Field of Search .................................. 359/124, 160, 359/177, 337, 341, 566

[56] References Cited

U.S. PATENT DOCUMENTS

| | | | |
|---|---|---|---|
| 5,268,786 | 12/1993 | Matsushita et al | 359/341 |
| 5,392,154 | 2/1995 | Chang et al | 359/349 |
| 5,463,487 | 10/1995 | Epworth | 359/124 |
| 5,510,926 | 4/1996 | Bayart et al | 359/179 |
| 5,600,473 | 2/1997 | Huber | 359/174 |
| 5,680,247 | 10/1997 | OKuno | 359/341 |

FOREIGN PATENT DOCUMENTS 4-78827  12/1992  Japan .
2294170  4/1996  United Kingdom .

OTHER PUBLICATIONS

Nolrabayashi et al, Technical Report of IE ICE, OCS94–66, OPE 94–89, pp. 1994–11.

*Primary Examiner*—Nelson Moskowitz
*Attorney, Agent, or Firm*—Scully, Scott, Murphy and Presser

[57] ABSTRACT

In an optical line repeater, a gain-controlled optical amplifier provides amplification of a wavelength division multiplex (WDM) signal from an incoming optical transmission link to compensate for signal attenuation. The amplified WDM signal is split into first and second replicas and the first replica is forwarded onto an outgoing optical transmission link. The second replica is used to determine the number of wavelength components actually multiplexed in the amplified WDM signal. A reference voltage is produced corresponding to the determined number of wavelength components. The difference between the reference voltage and the intensity of the amplified WDM signal is then detected and the gain of the optical amplifier is controlled with the detected difference so that the difference reduces to a minimum. The reference voltage automatically varies with the number of actually transmitted wavelength components to maintain the output power of each wavelength component constant.

5 Claims, 4 Drawing Sheets

OPTICAL AMPLIFIER GAIN CONTROL CIRCUITRY USING A VARIABLE REFERENCE CORRESPONDING TO THE NUMBER OF MULTIPLEXED WAVELENGTHS

BACKGROUND OF THE INVENTION

1. Field of the Invention

The present invention generally relates to optical communication systems, and more specifically to a technique for controlling the gain of an optical amplifier in an optical line repeater station which relays a wavelength division multiplex (WDM) signal.

2. Description of the Related Art

In an optical repeatered transmission system wherein repeater stations are located along the way from a sending terminal station to a receiving terminal station, traffic signals are carried on respective optical wavelengths, multiplexed into a single WDM (wavelength division multiplex) signal and forwarded from the sending station to the receiving station. Each repeater station amplifies the WDM signal using an optical linear amplifier to compensate for signal attenuation. In order to maintain the output power of the WDM signal constant at each line repeater station regardless of varying input power level, the amplifier gain of each repeater station is controlled in accordance with the difference between the amplified WDM signal and a constant reference power level. While the use of a constant reference power level is satisfactory for such systems where the number of multiplexed wavelengths (optical channels) is permanently fixed, it is disadvantageous for systems where the number of multiplexed optical channels varies with traffic demand or the like since the output power of each wavelength component may deviate from the reference with the varying number of multiplexed optical channels.

To overcome this problem, Japanese Laid-Open Patent Specification Hei-4-78827 describes an optical transmission system in which the sending terminal station uses a reference signal and transmits it exclusively on a specially reserved wavelength. Each repeater station on the way to the receiving terminal station extracts the reference signal and uses it as a reference power level to control its amplifier gain.

However, since the optical amplifier is gain-controlled in a feedback loop with the circuitry that extracts the reference signal, the feedback loop must be separated from traffic signals multiplexed with the reference signal. This requires all existing repeater stations to alter their system configuration. In addition, if the reference optical channel should fail, the gain control function of all repeater stations ceases to operate, and a total system failure would result.

SUMMARY OF THE INVENTION

It is therefore an object of the present invention to provide an improved optical line repeater which is capable of automatically adjusting optical amplifier gain according to the number of actually transmitted optical wavelength signals.

According to the present invention, there is provided an optical line repeater comprising a gain-controlled optical amplifier for amplifying a wavelength division multiplex (WDM) signal from an incoming optical transmission link, and an optical splitter for splitting the amplified WDM signal into first and second replicas and forwarding the first replica onto an outgoing optical transmission link. The number of wavelength components actually multiplexed in the amplified WDM signal is determined from the second replica of the amplified WDM signal, and a reference value is produced corresponding to the determined number. The difference between the reference value and the intensity of the amplified WDM signal is detected and the gain of the optical amplifier is controlled according to the detected difference so that the difference reduces to a minimum. Since the reference value automatically varies with the number of actually transmitted wavelength components, the output power of each wavelength component is maintained constant, regardless of the number of multiplexed optical channels.

BRIEF DESCRIPTION OF THE DRAWINGS

The present invention will be described in further detail with reference to the accompanying drawings in which.

DETAILED DESCRIPTION

Figure 1:
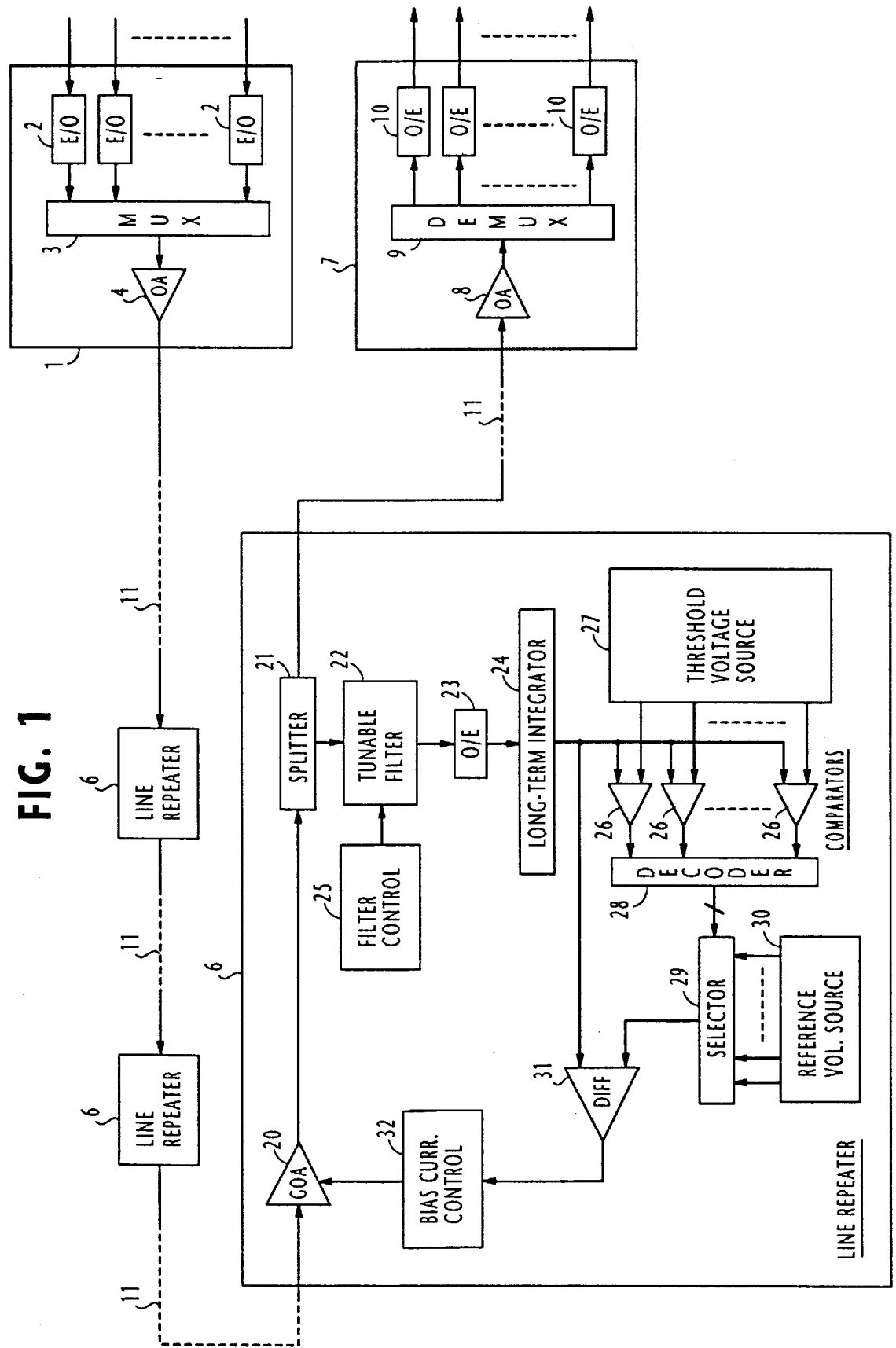
FIG. 1 is a block diagram of an optical repeatered transmission system according to a first embodiment of the present invention.

In FIG. 1, the optical repeatered transmission system of this invention is shown as comprising an optical transmitting station 1, an optical receiving station 7 and a plurality of optical line repeaters 6 interconnected between the transmitting and receiving stations by optical fiber links 11.

The transmitting station 1 includes a plurality of electro-optical (E/O) converters 2 and optical multiplexer 3 for receiving the outputs of the E/O converters. Each E/O converter transforms an electrical input signal to a corresponding optical signal on a unique wavelength so that the outputs of E/O converters 2 are wavelength-division multiplexed into a single WDM signal. While the wavelengths multiplexed in a WDM signal may be either narrowly (narrow-band) or widely (wide-band) spaced apart from each other, a narrow-band WDM signal is preferred for implementation. The WDM signal is then power-amplified by an optical amplifier 4 and forwarded onto link 11. Along the way to the receiving station 7, the WDM signal is successively amplified by the line repeaters 6. At the receiving station 7, the relayed WDM signal is amplified by an amplifier 8 and decomposed by an optical demultiplexer 9 into component wavelengths and respectively supplied to opto-electrical (O/E) converters 10 for conversion to original electrical signals.

As illustrated, each of the line repeaters 6 comprises a gain-controlled optical linear amplifier 20 for amplifying the transmitted WDM signal. The amplifier 20 comprises an erbium-doped optical fiber and a laser diode for pumping optical energy into the erbium-doped fiber, the bias current of the laser diode being adapted to be controlled externally so that it linearly varies the gain of the amplifier. The output of the amplifier 20 is coupled to an optical splitter 21 where it is split into two WDM replicas.

The first replica of the amplified WDM signal is forwarded onto the outgoing link 11 and the second replica of the amplified WDM signal is supplied to a tunable filter 22, where one of the wavelength components is selected and applied through an opto-electrical converter 23 to a long-term integrator 24. The tunable filter 22 is controlled by a filter controller 25. Controller 25 repeatedly scans across all optical wavelengths that can be transmitted from the transmitting station 1 and activates the tunable filter 22 with a discretely varying voltage (or current) that corresponds to each of the scanned wavelengths. Integrator 24 provides integration on the wavelength components successively passed through the tunable filter 22 over time (i.e., long-term) corresponding to the time taken to scan the maximum number of wavelengths.

The output of integrator 24 is compared by a plurality of comparators 26 with graduated threshold voltages supplied from a threshold voltage source 27. These threshold voltages respectively correspond to light intensities of different numbers of wavelength components actually transmitted, with the highest threshold voltage corresponding to the light intensity of the maximum number. Each comparator 26 produces a high-level output when the integrator output exceeds the corresponding threshold voltage. The outputs of comparators 26 are supplied to a decoder 28 which counts the number of high-level outputs and supplies a binary signal representing it to a selector 29. In response, selector 29 selects one of a plurality of reference voltages supplied from a reference voltage source 30. As a result, the selected reference voltage corresponds to the number of actually transmitted wavelength components.

A difference voltage representing the difference between the outputs of integrator 24 and selector 29 is produced by a differential amplifier 31. A bias current controller 32 uses this difference voltage to control the gain of optical linear amplifier 20 in a feedback loop so that the output of differential amplifier 31 reduces to a minimum. Therefore, when the number of actually transmitted wavelengths varies with different traffic needs, it is automatically detected and the reference input of the differential amplifier 30 is readjusted to the varying number of wavelengths.

In this way, the output power of each optical wavelength component relayed by each line repeater is maintained constant, regardless of the number of actually multiplexed wavelengths.

Figure 2:
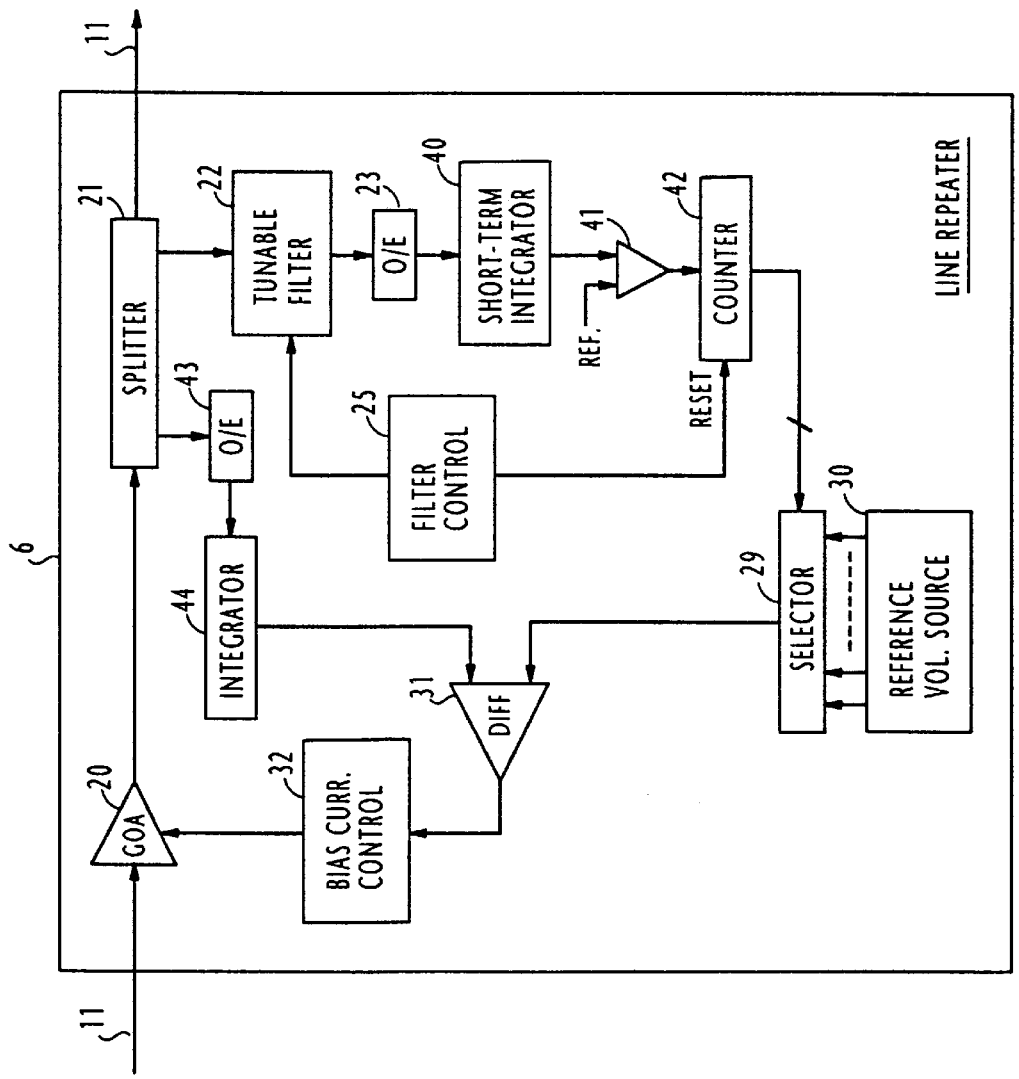
FIG. 2 is a block diagram of an optical repeatered transmission system according to a modified embodiment of the present invention.

A modified embodiment of FIG. 1 is shown in FIG. 2. According to this modification, the tunable filter 22 is driven by voltage (or current) pulses of time-varying amplitude and a short-term integrator 40 is connected to the output of O/E converter 23 to provide integration of each of the wavelength components selected by the tunable filter 22 over time (i.e., short-term) corresponding to the time taken to scan a single wavelength. The output of integrator 40 is supplied to a comparator 41 where it is compared with a threshold voltage to produce a high-level output when the integrator output is higher than the threshold voltage, indicating the presence of an optical signal at the scanned wavelength, and a low-level output when the integrator output is lower than the threshold voltage, indicating the absence of an optical signal at the scanned wavelength. The output of comparator 41 is counted by a binary counter 42.

When the filter controller 25 scans across all wavelengths that can be transmitted, it supplies a reset pulse to the counter 42 to cause it to supply a count value representing the number of wavelengths actually transmitted to the selector 29, while resetting its count to zero. Selector 29 responds to the counter output for supplying one of reference voltages from reference voltage source 30 to differential amplifier 31.

Optical splitter 21 further splits the incoming WDM signal and supplies its replica through an O/E converter 43 to an integrator 44 to produce a signal representing the total light intensity of actually transmitted wavelength components. The output of integrator 44 is supplied to differential amplifier 31 for comparison with the reference voltage that is selected by selector 29 according to the number of actually transmitted wavelength components.

Figure 3:
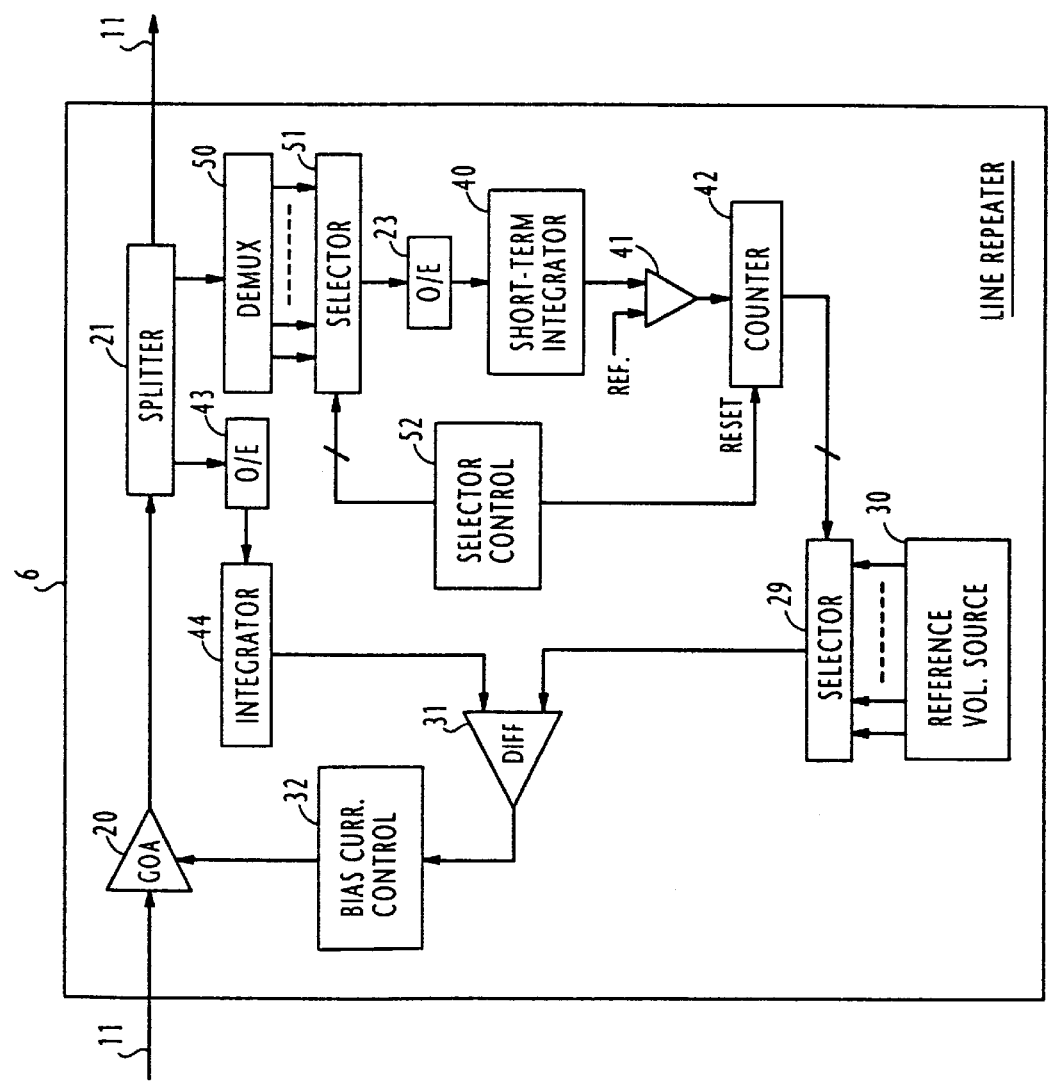
FIG. 3 is a block diagram of an optical repeatered transmission system according to a third embodiment of the present invention.

The number of actually multiplexed wavelengths can be determined by the use of elements other than a tunable filter. Shown in FIG. 3 is a modified embodiment of FIG. 2 in which an optical multiplexer 50 is connected to an output of the splitter 21 to decompose the WDM signal into all wavelength components that can be transmitted through the system. To the outputs of demultiplexer 50 is connected a selector 51, which includes an array of optical switches. A selector controller 52 scans across all wavelengths that can be transmitted through the system and supplies a switch control signal to a corresponding optical switch of the selector. When the selector controller 52 completes a scan, it resets the counter 42 to cause it to produce an output representing the actual number of wavelengths and deliver its binary count to selector 29.

Figure 4:
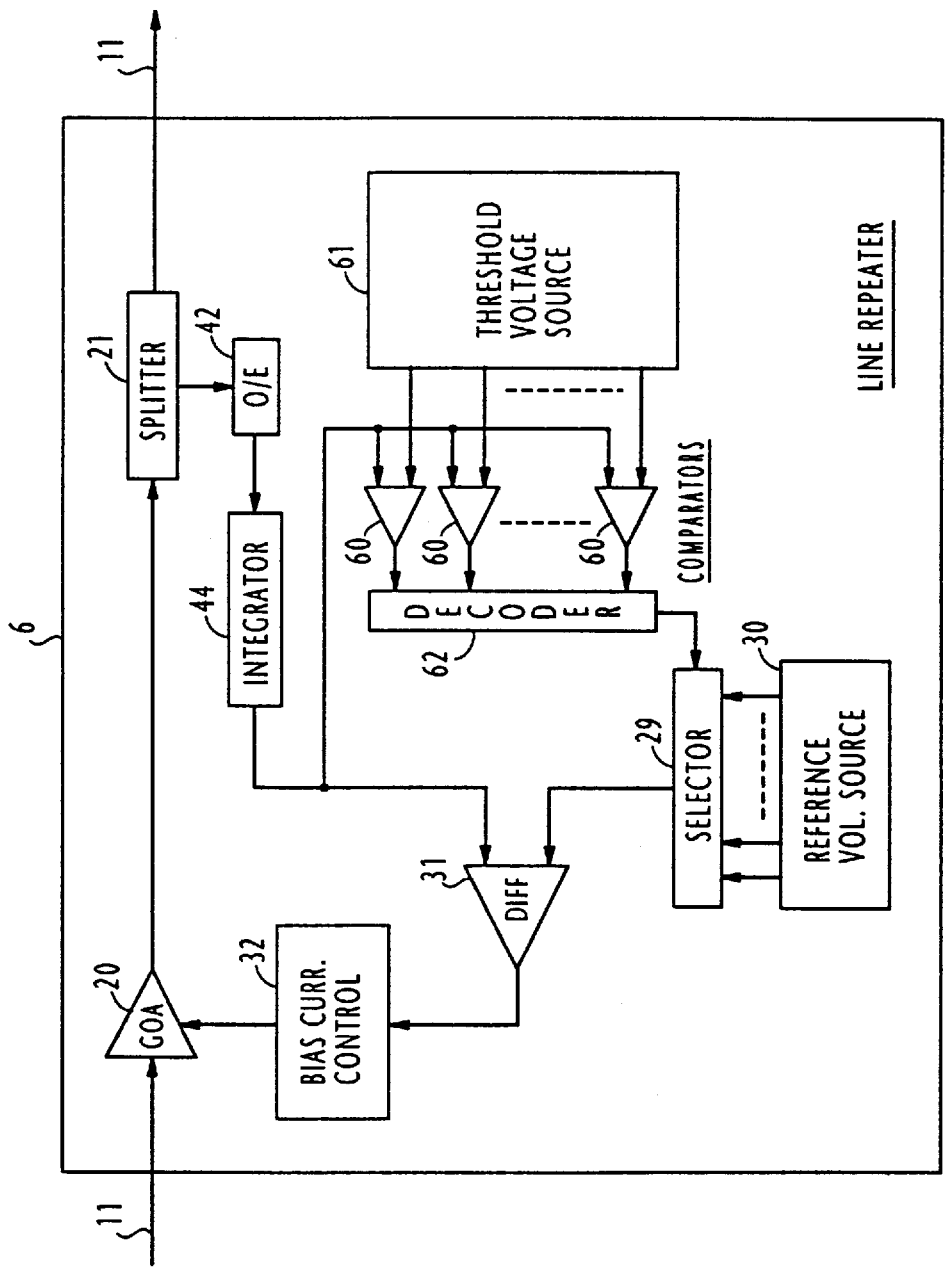
FIG. 4 is a block diagram of an optical repeatered transmission system according to a fourth embodiment of the present invention.

A further modification of this invention is shown in FIG. 4 in which a plurality of comparators 60 are provided for comparing the total light intensity of the WDM signal obtained by integrator 44 with graduated threshold voltages from a threshold voltage source 61. Each comparator 60 produces a high-level output when the output of integrator 44 exceeds the reference voltage from selector 29. The outputs of comparators 60 are coupled to a decoder 62 which converts the number of high-level outputs of comparators 60 into a binary signal and supplies it to the selector 29 as an indication of the number of wavelengths actually transmitted.

What is claimed is:

1. An optical line repeater comprising:

a gain-controlled optical amplifier for amplifying a wavelength division multiplex (WDM) signal from an incoming optical transmission link;

an optical splitter for splitting the amplified WDM signal into first and second replicas and forwarding the first replica onto an outgoing optical transmission link;

means for determining, from said second replica, a number of wavelength components multiplexed in said amplified WDM signal and producing a reference value corresponding to said number; and means for detecting a difference between said reference value and intensity of said amplified WDM signal and controlling the gain of said optical amplifier according to the detected difference so that the detected difference reduces to a minimum.

2. An optical line repeater as claimed in claim 1, wherein said means for determining a number of wavelength components comprises:

an optical tunable filter for receiving the second replica of said amplified WDM signal;

filter control means for causing the tunable filter to successively tune to all wavelengths which can be transmitted over said incoming and outgoing transmission links;

an opto-electrical converter for converting a wavelength component supplied from the tunable filter to an electrical signal;

an integrator for integrating said electrical signal over a period of time taken by said tunable filter to select said all wavelength components;

a plurality of comparators for comparing an output signal of said integrator with each of graduated threshold values and producing an output signal from each one of the comparators when the integrator output signal is greater than a corresponding one of said threshold values;

decoder means for receiving output signals from said comparators and detecting a number of the received output signals; and means for producing said reference value corresponding to the detected number.

3. An optical line repeater as claimed in claim 1, wherein said means for determining a number of wavelength components comprises:

an optical tunable filter for receiving the second replica of said amplified WDM signal;

filter control means for causing the tunable filter to successively tune to all wavelengths which can be transmitted over said incoming and outgoing transmission links;

an opto-electrical converter for converting a wavelength component supplied from the tunable filter to an electrical signal;

an integrator for integrating said electrical signal over a period of time taken by said tunable filter to select one of said wavelength components;

a comparator for comparing an output signal of said integrator with a threshold value and producing an output signal when the integrator output signal is greater than the threshold value;

a counter for detecting a number of output signals produced by said comparator during said period of time; and means for producing said reference value corresponding to the detected number.

4. An optical line repeater as claimed in claim 1, wherein said means for determining a number of wavelength components comprises:

an optical demultiplexer for demultiplexing the second replica of said amplified WDM signal into all wavelengths which can be transmitted over said transmission links;

an optical selector for selecting one of the demultiplexed wavelengths;

selector control means for causing the optical selector to successively select all the demultiplexed wavelength components;

an opto-electrical converter for converting the wavelength component selected by the optical selector to an electrical signal;

an integrator for integrating said electrical signal over a period of time taken by said optical selector to select one of said wavelength components;

a comparator for comparing an output signal of said integrator with a threshold value and producing an output signal when the integrator output signal is greater than the threshold value;

a counter for detecting a number of output signals produced by said comparator during said period of time; and means for producing said reference value corresponding to the detected number.

5. An optical line repeater as claimed in claim 1, wherein said means for determining a number of wavelength components comprises:

a plurality of comparators for comparing the intensity of said amplified WDM signal with each of a plurality of graduated threshold values and producing an output signal from each one of the comparators when said intensity is greater than a corresponding one of said threshold values;

decoder means for receiving output signals from said comparators and detecting a number of the received output signals; and means for producing said reference value corresponding to the detected number.

* * * * *